United States Patent
Jain et al.

(10) Patent No.: US 11,380,622 B2
(45) Date of Patent: Jul. 5, 2022

(54) METHOD AND RELATED STRUCTURE TO AUTHENTICATE INTEGRATED CIRCUIT WITH AUTHENTICATION FILM

(71) Applicant: GLOBALFOUNDRIES U.S. INC., Santa Clara, CA (US)

(72) Inventors: Vibhor Jain, Williston, VT (US); Sunil K. Singh, Mechanicville, NY (US); Johnatan A. Kantarovsky, South Burlington, VT (US); Siva P. Adusumilli, South Burlington, VT (US); Sebastian T. Ventrone, South Burlington, VT (US); John J. Ellis-Monaghan, Grand Isle, VT (US); Yves T. Ngu, Essex Juntion, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/953,441

(22) Filed: Nov. 20, 2020

(65) Prior Publication Data
US 2022/0165676 A1    May 26, 2022

(51) Int. Cl.
*H01L 23/544*    (2006.01)
*H01L 23/00*     (2006.01)

(52) U.S. Cl.
CPC .......... *H01L 23/544* (2013.01); *H01L 23/576* (2013.01)

(58) Field of Classification Search
CPC ..................................................... H01L 21/302
USPC .......................................................... 257/666
See application file for complete search history.

(56) References Cited

U.S. PATENT DOCUMENTS

| | | | |
|---|---|---|---|
| 9,685,958 B2 | 6/2017 | Bhunia et al. | |
| 10,095,889 B2 | 10/2018 | Pedersen et al. | |
| 10,263,793 B2 | 4/2019 | Rezayee et al. | |
| 10,623,192 B2 | 4/2020 | Wang | |
| 10,657,291 B2 | 5/2020 | Pedersen et al. | |
| 2008/0157314 A1* | 7/2008 | Clevenger | H01L 21/31144 257/679 |
| 2009/0091038 A1 | 4/2009 | Chen et al. | |
| 2013/0224653 A1* | 8/2013 | Itatani | C08G 73/1067 430/270.1 |
| 2021/0039420 A1* | 2/2021 | Costa | B42D 25/324 |

FOREIGN PATENT DOCUMENTS

WO    WO-2020185822 A1 *    9/2020    ....... H04N 21/44204

* cited by examiner

*Primary Examiner* — Ajay Arora
(74) *Attorney, Agent, or Firm* — Anthony Canale; Hoffman Warnick LLC

(57) ABSTRACT

The disclosure provides a method to authenticate an integrated circuit (IC) structure. The method may include forming a first authentication film (AF) material within the IC structure. A composition of the first AF material is different from an adjacent material within the IC structure. The method includes converting the first AF material into a void within the IC structure. Additionally, the method includes creating an authentication map of the IC structure to include a location of the void in the IC structure for authentication of the IC structure.

18 Claims, 9 Drawing Sheets

US 11,380,622 B2

METHOD AND RELATED STRUCTURE TO AUTHENTICATE INTEGRATED CIRCUIT WITH AUTHENTICATION FILM

TECHNICAL FIELD

Embodiments of the disclosure relate generally to authentication of integrated circuits (ICs). More specifically, embodiments of the disclosure provide a structure and method to authenticate ICs by way of authentication film (AF) materials.

BACKGROUND

In the microelectronics industry, the ability to reverse-engineer chips has become of increasing concern. As reverse engineering becomes more widespread, counterfeit chips have begun to enter the supply chain. In some cases, an external entity with temporary custody over a product in the supply chain may be able to insert extra circuits or "back doors" into sensitive active portions of a product.

Counterfeiting and/or tampering may arise in many contexts. In the example of a medical device, the effects of a counterfeit chip may range from innocuous effects (e.g., incoherent data on a display) to critical failures (e.g., erratic pacemaker clocking). In some cases, these effects may be difficult to discern from random errors and/or degradation from age. As partnership between manufacturers across the globe becomes increasingly important to manufacturing effectiveness, possible weaknesses to tampering in the supply chain have become increasingly important to manufacturers and customers.

SUMMARY

Aspects of the disclosure provide a method to authenticate an integrated circuit (IC) structure, the method including: forming a first authentication film (AF) material within the IC structure, wherein a composition of the first AF material is different from an adjacent material within the IC structure; converting the first AF material into a void within the IC structure; and creating an authentication map of the IC structure, the authentication map including a location of the void in the IC structure for authentication of the IC structure.

Further aspects of the disclosure provide an integrated circuit (IC) structure, including: a polyimide layer over a plurality of metal wiring layers, the polyimide layer including a first region having at least one electrically active element, and a second region horizontally distal to the at least one electrically active element; and a void within the second region of the polyimide layer, wherein a location of the void within the polyimide layer defines an authentication pattern for the IC structure.

Additional aspects of the disclosure provide an integrated circuit (IC) structure, including: a polyimide layer; a metal wiring layer beneath the polyimide layer, the metal wiring layer including a first region having at least one electrically active element, and a second region horizontally distal to the at least one electrically active element; a void within the second region of the metal wiring layer, wherein a location of the void within the metal wiring layer defines an authentication pattern for the IC structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
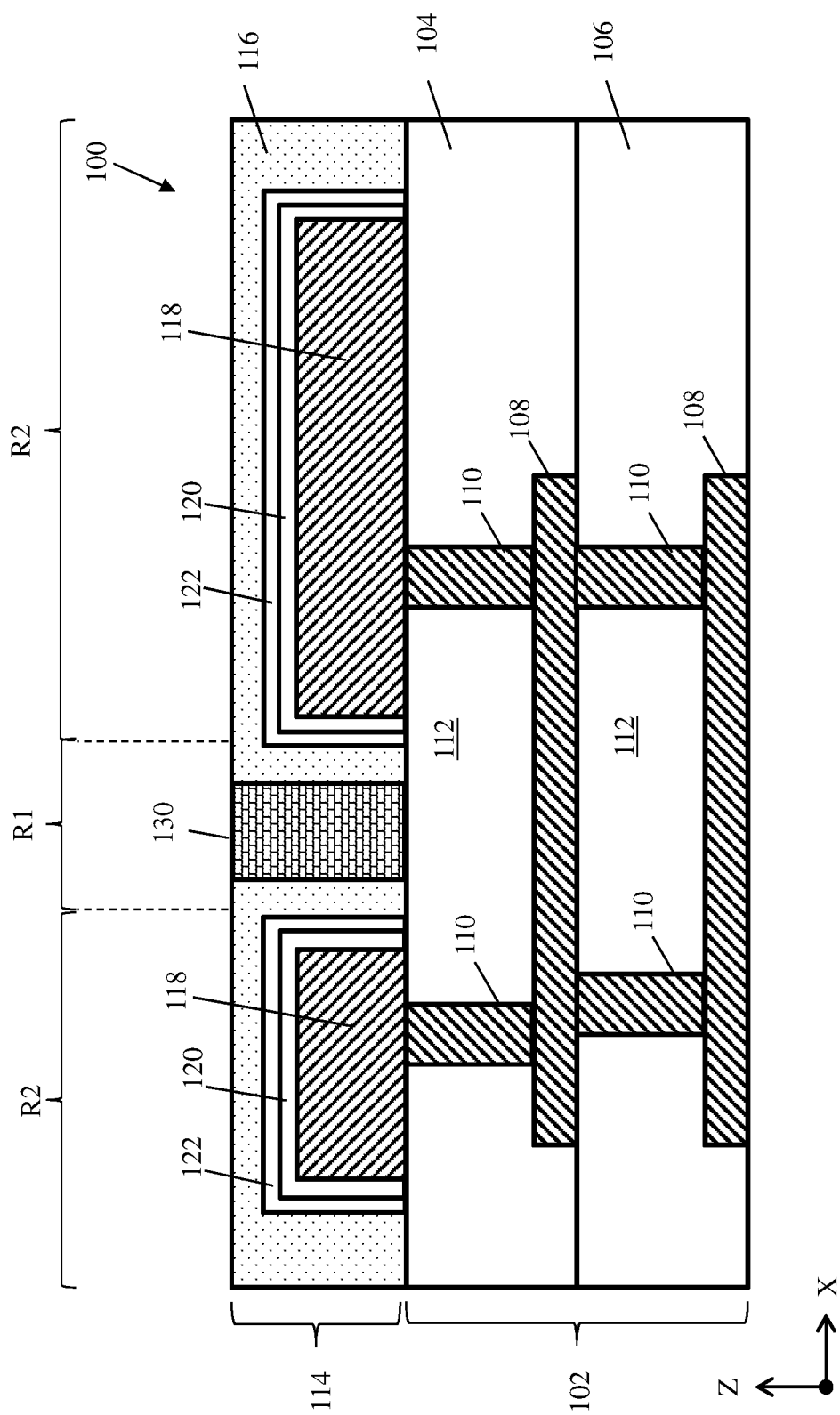
FIG. 1 depicts cross-sectional view of an IC structure with an authentication film (AF) material according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment"

or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to methods to authenticate integrated circuit (IC) structures, and structures that include features for authentication. Methods according to the disclosure may include forming an authentication film (AF) material (e.g., one or more layers of material capable of being converted into voids via evaporation, etching, and/or other techniques) within an IC structure. The AF material may be formed as one or more regions or patterns. The AF material may be sized for selective or non-selective treatment (e.g., removal) of portions of the AF material. With the AF material in place, a portion or all of the AF material may be converted into a void. The void may be optically detectable and/or distinguishable from adjacent materials via a microscope, whereas the AF material may not be optically distinct. The method also includes creating an authentication map of the IC structure, indicating a location of the void, and optionally, any portions of AF material that remain in the IC structure. The authentication map may be provided solely to a recipient of the IC structure, e.g., via secure communication channel(s). The recipient may examine the IC structure to see whether the void, and where applicable, remaining portions of AF material match corresponding locations within the authentication map. In some cases, each distinct unit of the IC structure may have a unique authentication map.

An IC structure according to the disclosure may include various physical elements for implementing methods according to the disclosure, and/or other authentication features. An IC structure according to the disclosure may include one or more voids located within a region that is horizontally displaced from one or more electrically active elements, e.g., within a local interconnect or metal wiring layer. The location of the voids may provide an authentication pattern for the IC structure. In further implementations, portions of AF material may also be within the region of the IC structure. Further processing and/or modifying of the IC structure may convert any remaining portions of the AF material into voids, thus indicating unauthorized processing and/or tampering of the IC structure.

Referring to FIG. 1, embodiments of the disclosure may include and/or may be implemented on an integrated circuit (IC) structure 100. The methods described herein may yield an IC structure according to one or more embodiments of the disclosure. IC structure 100 may represent part of an initial material distributed across a two-dimensional area in plane X-Y, and FIG. 1 illustrates a cross-section of IC structure 100 in the X-Z plane. IC structure 100 includes a set of metal wiring layers 102 having multiple distinct layers (e.g., a first metal level 104 and a second metal level 106), with various additional layers (not shown) being positioned thereunder. Metal wiring layer(s) 102 may be positioned over one or more layers containing various devices, e.g., transistors, resistors, capacitors, etc. The forming and position of such devices is generally understood in the art and not relevant to embodiments of the disclosure, and thus omitted.

Metal wiring layer(s) 102 as noted herein may include several metal wires within each layer, in addition to several layers of insulating material. The various layers of metal wiring layer(s) 102 may include active circuitry including, e.g., metal wires 108, vias 110, and/or other elements such as conductive interconnects and/or other conductive elements. Conductive materials of metal wiring layer(s) 102, e.g., metal wires 108 and/or vias 110 may include materials such as copper (Cu), aluminum (Al), and/or any other type of conductive material. The conductive materials of metal wiring layer(s) 102 may extend horizontally or vertically through a set of inter-level dielectric (ILD) layers 112. ILD layer(s) 112 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. First layer 104 may be an uppermost metal layer of metal wiring layer(s) 102, with second layer 106 may be the next layer thereunder. Metal wiring layer(s) 102 may have any conceivable number of layers, each having their own set of metal wires 108, vias 110, etc., therein.

IC structure 100 may include a local interconnect (LI) layer 114 over metal wiring layer(s) 102 for electrically coupling metal wiring layer(s) 102 to other IC components. LI layer 114 may include a polyimide material 116, e.g., one or more photosensitive polyimides (PSPIs), benzocyclobutene (BCB), epoxy, poly(p-phenylene-2,6-benzobisoxazole) (PBO), and/or similar materials alone or in any conceivable combination. As noted elsewhere herein, one or more compounds within polyimide material 116 may be porous or non-porous, and porous materials may allow for evaporated materials to pass through polyimide material 116 in methods according to the disclosure. LI layer 114 additionally may itself include one or more LI conductors 118, e.g., contact pads and/or wires for connecting metal wires 108 and/or vias 110 of metal wiring layer(s) 102 to various interconnect components (e.g., solder bumps and/or structures for interfacing with an IC). Various layers of insulating material may protect LI conductors 118 of LI layer 114 from polyimide material 116, and such materials may include an oxide layer 120 formed on LI conductor(s) 118 and a nitride layer 122 formed between oxide layer 120 and polyimide material 116. Depending on the type of IC and/or intended application for IC structure 100, oxide layer 120 and/or nitride layer 122 may be omitted and/or used in conjunction with additional insulating materials.

Embodiments of the disclosure may include forming a first authentication film (AF) material 130 within IC structure 100. First AF material 130 is formed over metal wiring layers 102 and within LI layer 114 in one example, but as discussed in detail elsewhere herein, first AF material 130 optionally may be formed within metal wiring layer(s) 102. First AF material 130 may include, e.g., any type of material that is capable of being evaporated under prescribed conditions and thus may include one or more carbon-based energy removal film (ERF) materials. In such cases, first AF material 130 may evaporate by application of heat to a predetermined temperature that is less than the phase change temperature of other materials in IC structure 100. First AF material 130, in this case, may include one or more carbon-based organic materials (e.g., porogens) deposited via a spin on or chemical vapor deposition (CVD) process, and cured with the aid of ultraviolet light. Such materials may be cured at a temperature of between approximately three-hundred and four-hundred degrees Celsius (° C.). First AF material 130 in various implementations may include a carbon-based $C_xH_y$ compound, where "x" and "y" denote varying numbers of carbon and hydrogen atoms, respectively. In further examples, first AF material 130 may include an oxide film, nitride film, and/or other material capable of being selectively removed with respect to adjacent materials (e.g., ILD layer(s) 112, polyimide material 116, etc.). In this case, portions of first AF material 130 can be removed via forming a mask (not shown) and etching first AF material 130 through openings in the mask. However embodied, first AF material 130 may be formed to a thickness of at least approximately fifty Angstroms above metal wiring layer(s) 102, and in further implementations may have a thickness of ten micrometers (µm) or more above metal wiring layer(s) 102. However embodied, the composition of first AF material 130 may be optically indistinguishable from adjacent materials (e.g., ILD layer(s) 112, polyimide material 116) without the use of enhanced imaging technology (e.g., thermal imaging, enhanced microscopy, etc.).

Figure 2:
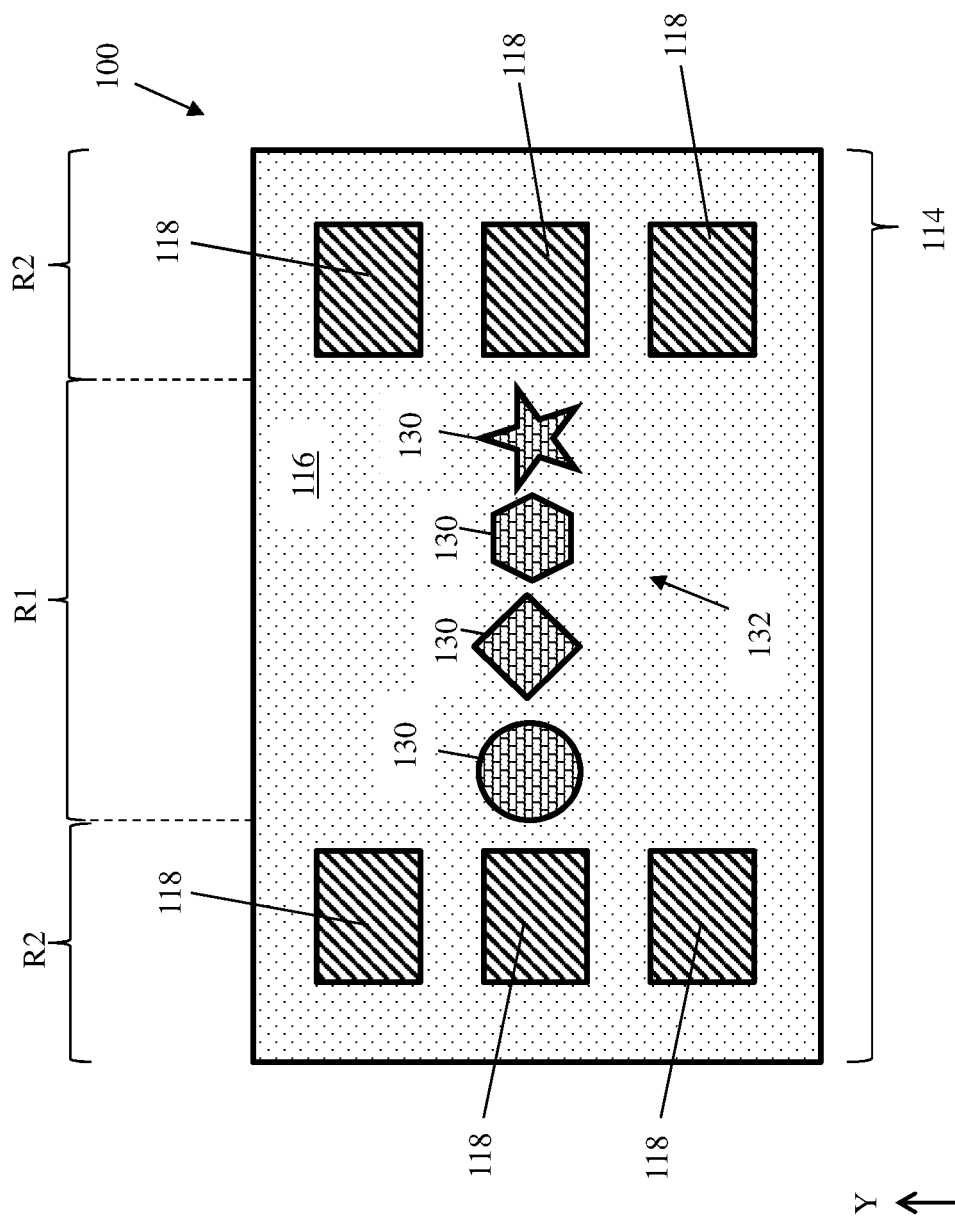
FIG. 2 depicts a plan view of an IC structure with an initial pattern formed of AF material according to embodiments of the disclosure.

Referring now to FIG. 2, first AF material 130 may be formed in a first region R1 of IC structure 100 that is distal to one or more electrically active components, or otherwise separated from active components in a second region R2 of IC structure 100. Such active components may include LI conductors 118 (e.g., wires, pads, etc., as discussed herein), and/or other conductive materials. As shown in FIG. 2, multiple regions of first AF material 130 may be formed in a pattern 132 on IC structure 100. Pattern 132 may include four regions of first AF material 130 to create a group of distinct shapes (e.g., circle, diamond, hexagon, star, as shown) in an example implementation. Although first AF material 130 and pattern 132 are shown in FIG. 2 to be within polyimide material 116, they may be within metal wiring layer(s) 102 in other implementations, as discussed herein. Any conceivable number of first AF material 130 regions may be formed on IC structure 100 to create icons such as readily identifiable symbols, e.g., letters, shapes, icons, and/or areas of first AF material 130 that seemingly have no recognizable pattern or shape. However arranged, pattern 132 of first AF material 130 may originate from a design for IC structure 100. Further processing according to the disclosure may include converting first AF material 130 into empty space ("voids," discussed herein) that may be compared with an authentication map to verify that IC structure 100 has not been altered without authorization.

Figure 3:
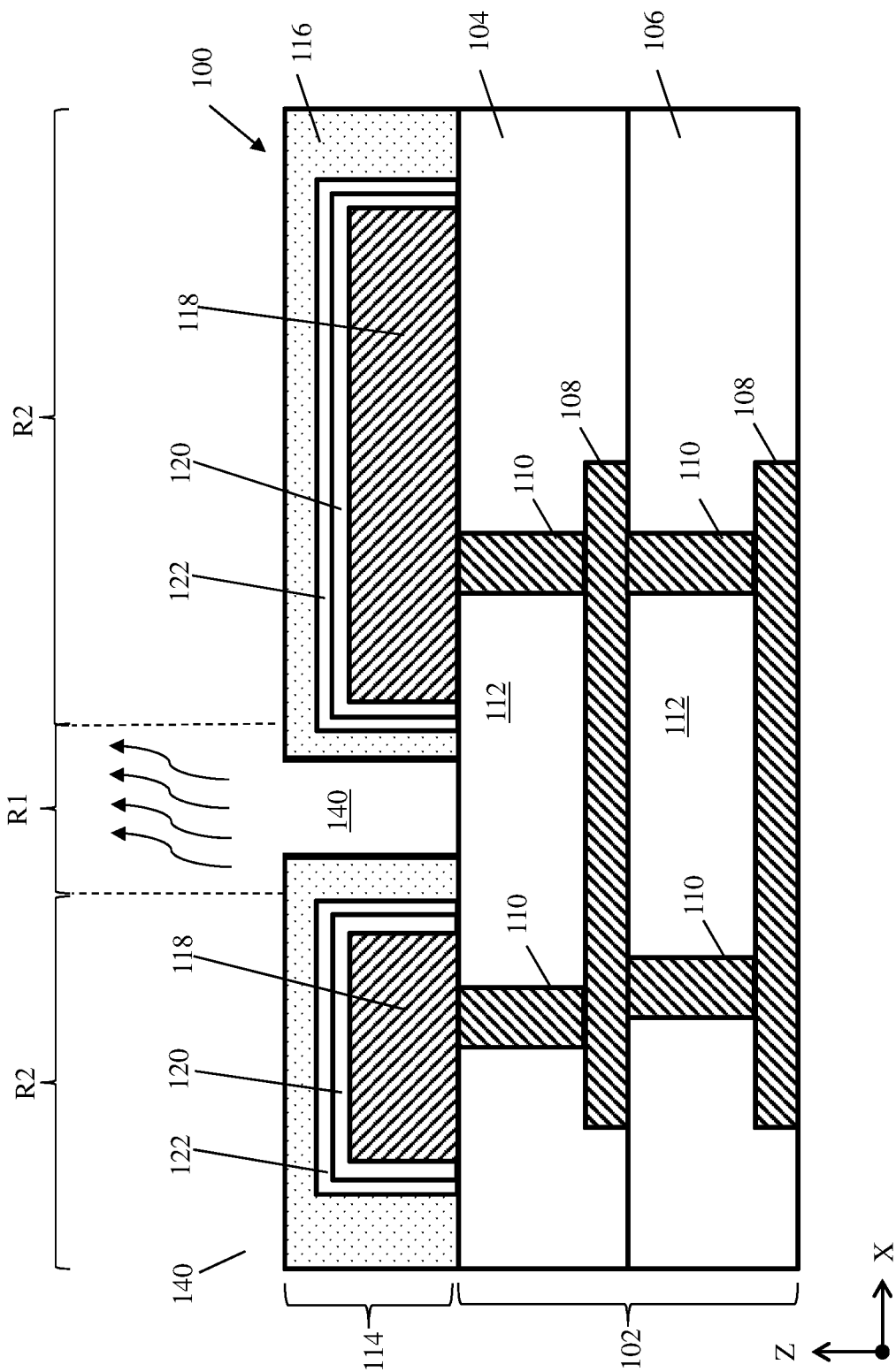
FIG. 3 depicts a cross-sectional view of converting the AF material into a void according to embodiments of the disclosure.

FIG. 3 depicts a cross-sectional view of a process to convert of first AF material 130 (FIGS. 1, 2) into voids 140 for authentication of IC structure 100. In some implementations (e.g., where first AF material 130 includes an ERF material), methods according to the disclosure may include subjecting IC structure 100 to ultraviolet light at an elevated temperature (e.g., three-hundred to four-hundred ° C.) to evaporate any exposed portions of first AF material 130. In further examples, e.g., where first AF material 130 includes an oxide, first AF material 130 may be converted into void(s) 140 by forming a mask on IC structure 100 and etching first AF material 130 from IC structure 100. The converting of first AF material 130 into void(s) 140 may not have any effect on electrically active components in second region R2 (e.g., conductors within LI layer 114 and/or metal wiring layers 102) due to the placement of first AF material 130 in first region R1, away from electrically active components of IC structure 100. After void(s) 140 are formed, any heat sources, etching tools, etc., used for the conversion may be removed from IC structure 100.

Figure 4:
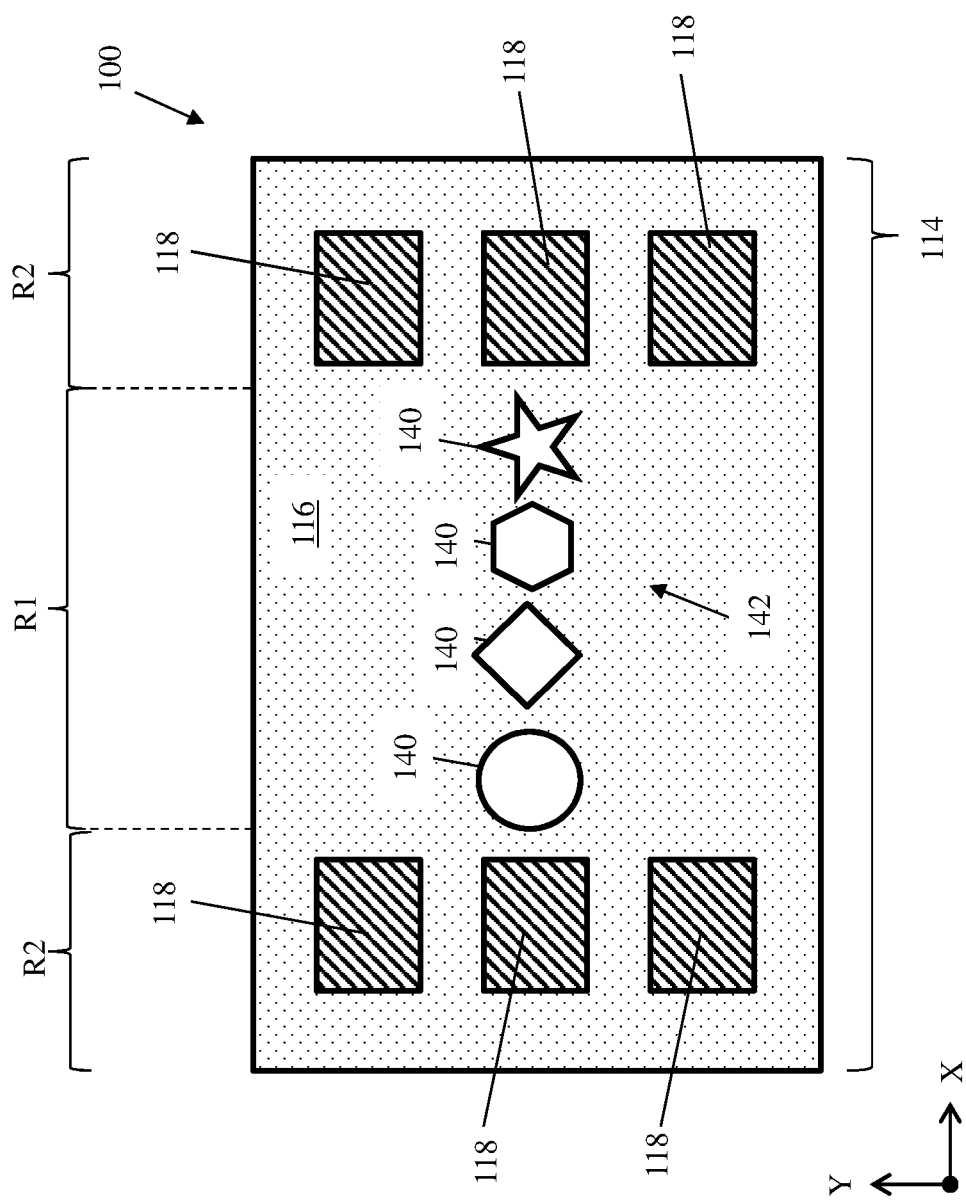
FIG. 4 depicts a plan view of an IC structure with a pattern of voids according to embodiments of the disclosure.

Turning to FIG. 4, the converting of first AF material 130 into voids 140 may yield a pattern 142 of voids 140 on IC structure 100. As compared with first AF material 130, voids 140 may be optically detectable relative to adjacent materials (e.g., ILD layer(s) 112 (FIGS. 1, 2), polyimide material 116) via microscope or other visual analysis of IC structure 100. Pattern 142 may include the same icons (e.g., shapes, letters, and/or other identifiable structures) in which first AF material 130 was previously formed in IC structure 100. Pattern 142 may be included entirely within first region R1 of IC structure without active elements (e.g., LI conductor(s) 118) therein, such that voids 140 do not interfere with the active components of IC structure 100 in second region R2. Methods according to the disclosure may include optically analyzing IC structure 100 (e.g., via a microscope) to locate pattern(s) 142. If pattern(s) 142 exist in the same location as an authentication map for IC structure 100, a recipient of IC structure 100 will know that the product is authentic. In some cases, the conversion of first AF material 130 into void(s) 140 may be implemented by the recipient itself, such that the location of pattern 142 is not known or visible to an intermediate recipient of IC structure 100 who has not received the authentication map for IC structure 100.

Figure 5:
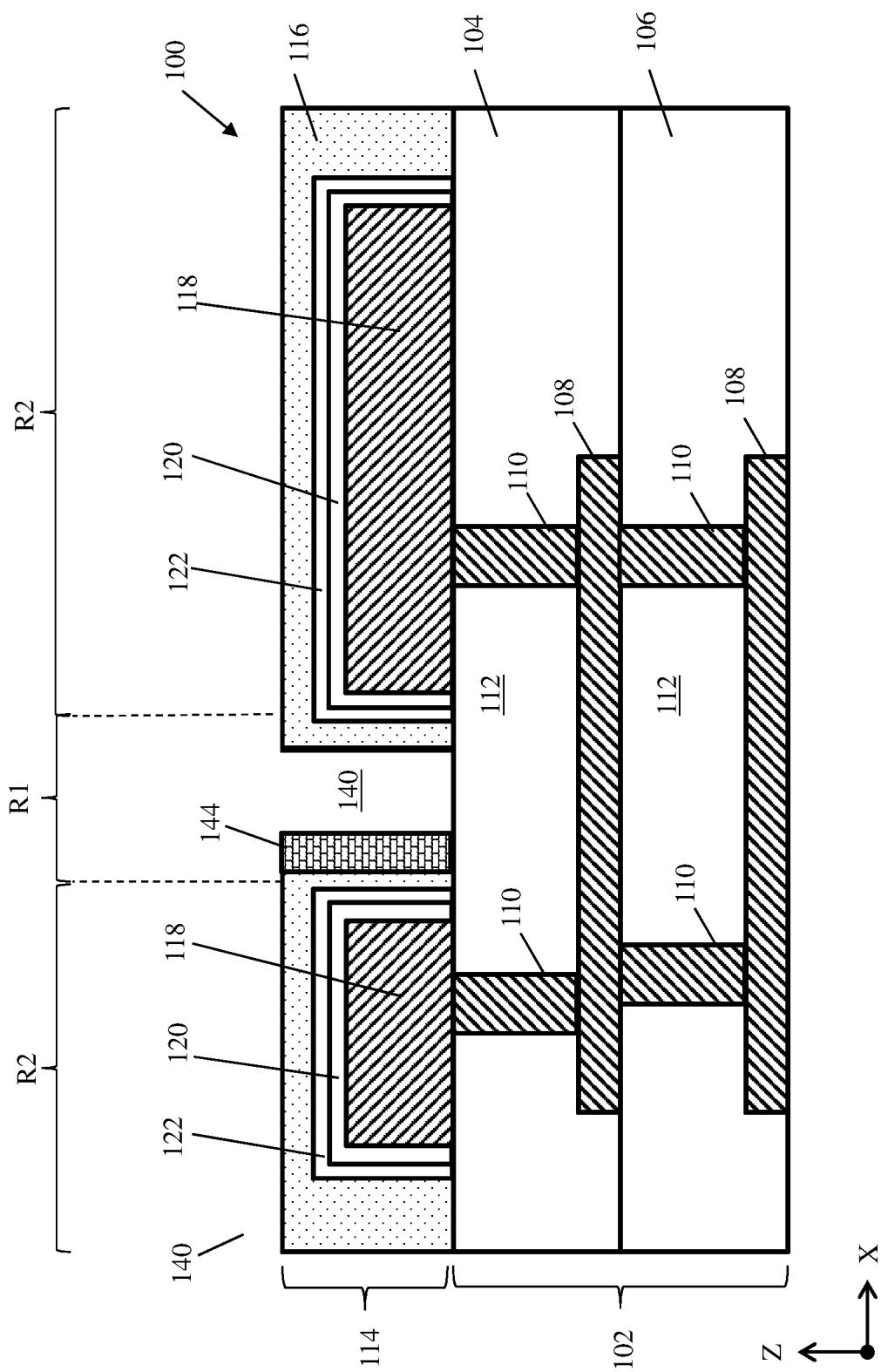
FIG. 5 depicts a cross-sectional view of forming another AF material in portions of a void according to embodiments of the disclosure.

Referring now to FIG. 5, some methods and/or structures according to the disclosure may include only partial removal, and/or reforming of, AF material(s) to yield a second AF material 144 on IC structure 100. In this case, voids 140 and second AF material 144 both may be used to authenticate IC structure 100. FIG. 5 depicts a cross-section of IC structure 100 with a portion of void 140 filled with second AF material 144. Second AF material 144 may be formed, e.g., by forming an additional mask (not shown) and depositing second AF material 144 into exposed area of void(s) 140. In a further example, second AF material 144 can be formed by converting only a portion of first AF material 130 (FIGS. 1, 2) into void(s) 140, e.g., by controlled application of UV light, etching, etc., to yield second AF material 144 and void(s) 140.

Figure 6:
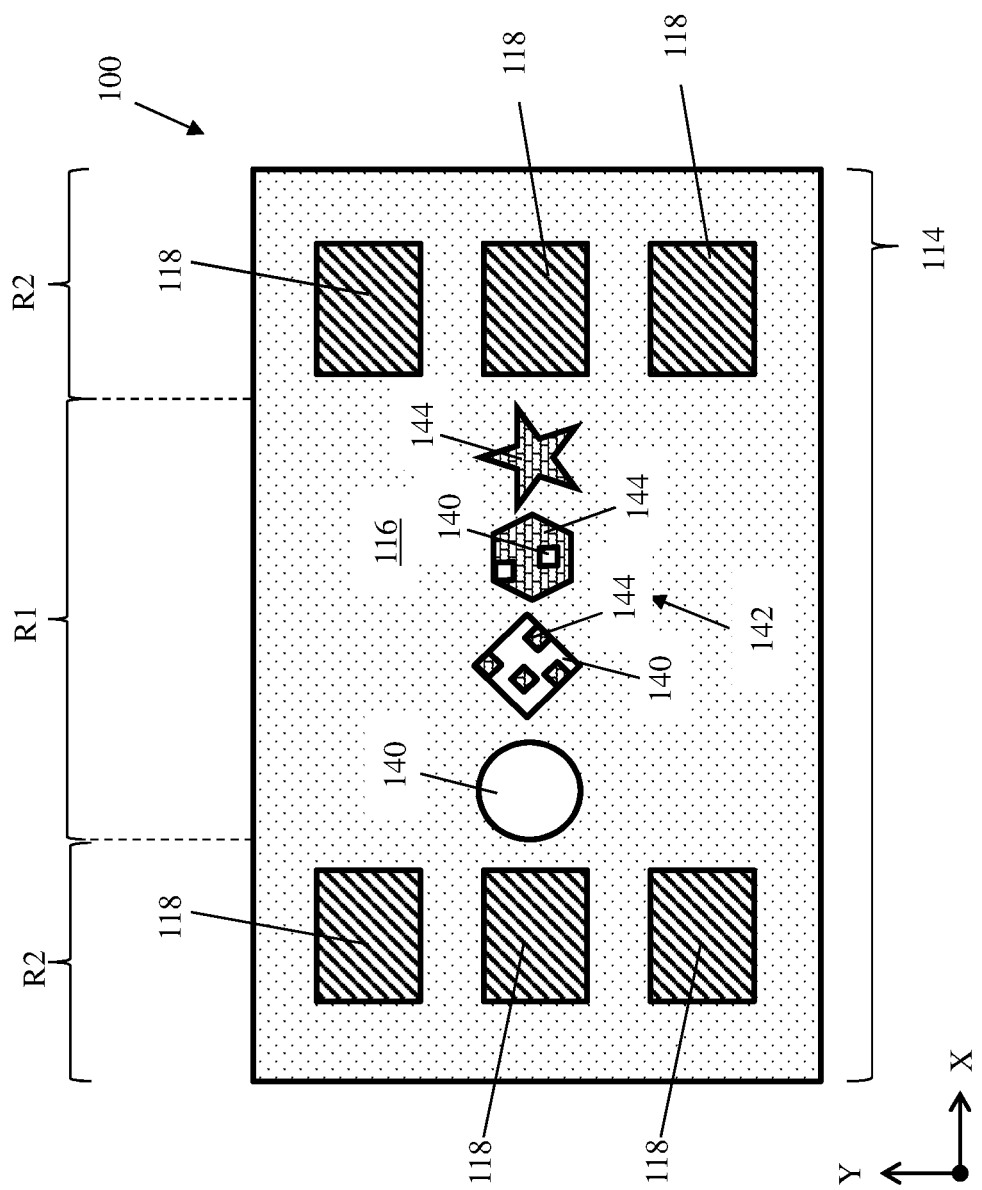
FIG. 6 depicts a plan view of an IC structure with a pattern of AF material and voids according to embodiments of the disclosure.

FIG. 6 depicts a plan view of IC structure 100, in which pattern 142 includes a combination of voids 140 and second AF material 144. In this case, some voids 140 may be completely free of second AF material 144, some portions of second AF material 144 may not include voids 140, and/or different areas may include different amounts of void(s) 140 and/or second AF material 144 therein. The distribution of second AF material 144 across IC structure 100 may be non-uniform, i.e., different amounts of second AF material 144 may appear to be randomly or pseudo-randomly distributed across the cross-sectional area of IC structure 100, or otherwise may not have a recognizable pattern without the aid of an authentication map. Optical inspection of IC structure 100 with the aid of a microscope may allow a user to identify the location of voids 140 relative to second AF material 144 and adjacent materials, for comparison against an authentication map of IC structure 100. The presence of second AF material 144 may allow for multiple phases of authentication, e.g., by identifying pattern 142 with second AF material 144 therein, before second AF material 144 is converted into additional voids. The resulting pattern 142 without voids 140 may then be authenticated by way of another authentication map. With this approach, multiple recipients of IC structure 100 may authenticate IC structure 100 using the location of voids 140 and/or second AF material 144.

Figure 7:
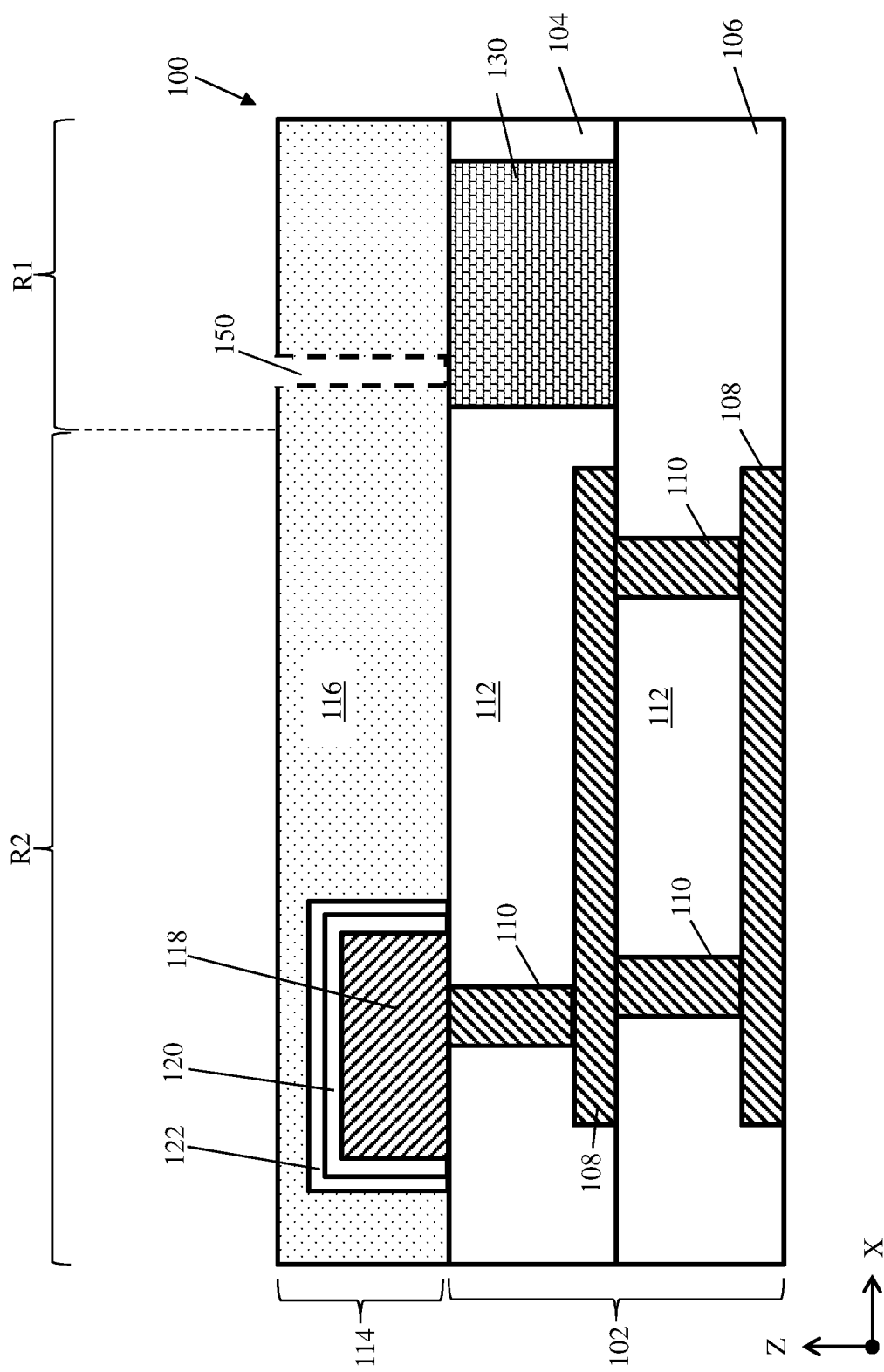
FIG. 7 depicts a cross-sectional view of AF material in a metal wiring layer according to embodiments of the disclosure.

Referring now to FIG. 7, methods according to the disclosure may include forming a first AF material 130 within metal wiring layer(s) 102 before LI layer 114 is formed thereover. First AF material 130 may be formed within portions of first metal level 104 in an example, but it is possible for first AF material 130 to be formed additionally or alternatively within second metal level 106 and/or any other levels of metal wiring layer(s) 102 in IC structure 100. In this case, polyimide material 116, or another metal level within metal wiring layer 102, may cover a top surface of first AF material 130. Any of the various techniques to convert first AF material 130 into void(s) 140 discussed herein may be used on AF material(s) 130 within metal wiring layer(s) 102. For example, where first AF material(s) 130 include oxide materials, portions of metal wiring layer(s) 102 may be removed via etching with a mask in place to yield void(s) 140 at targeted locations. Polyimide material(s) 116 and/or portions of metal wiring layer(s) 102 thereunder may also include opening(s) 150 for evaporation of first AF material(s) 130 under application of heat. To allow evaporated AF material(s) to escape IC structure 100, opening(s) 150 may have a diameter of, e.g., at least approximately one micrometer μm, although this may vary in further implementations.

Figure 8:
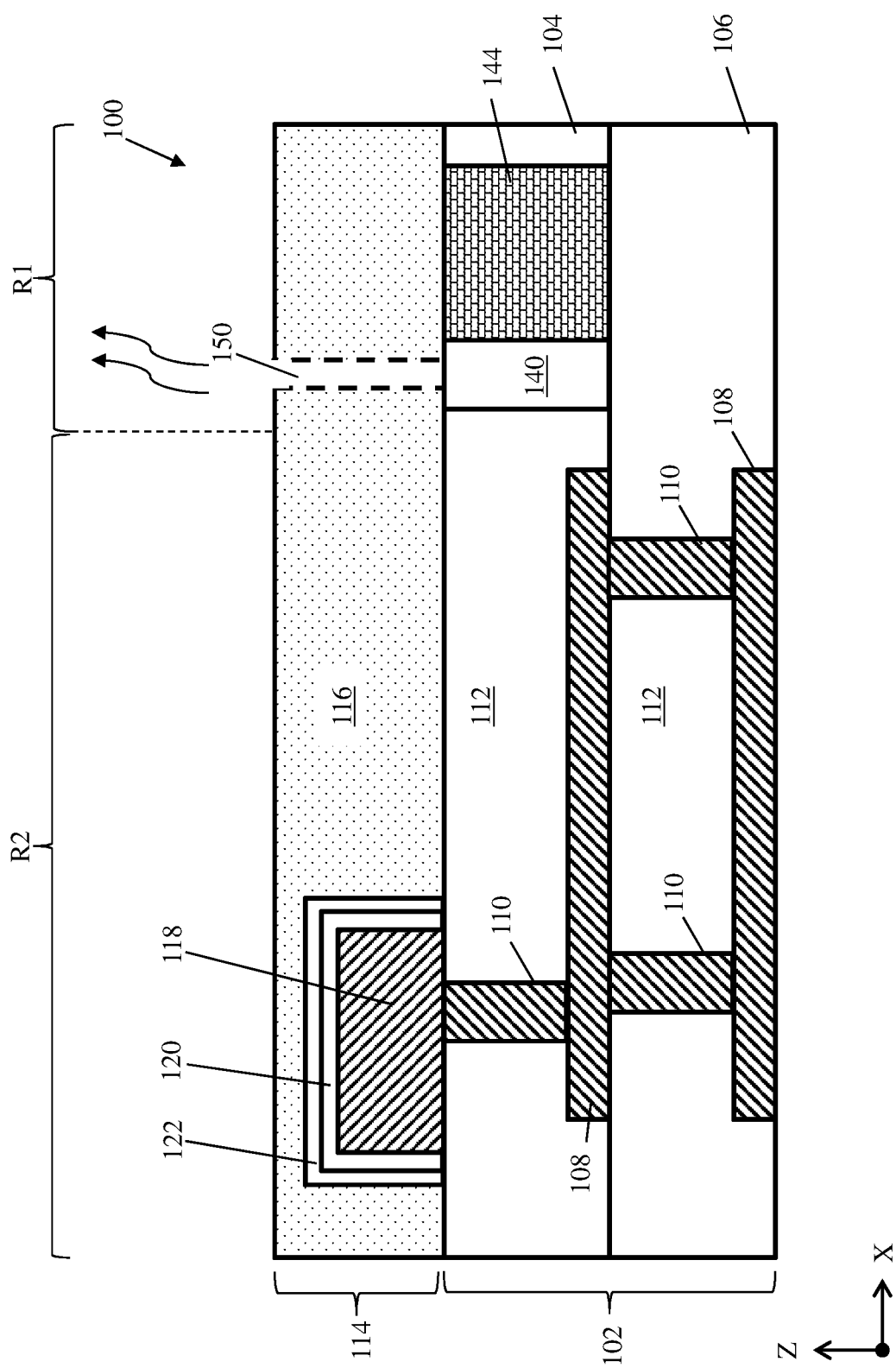
FIG. 8 depicts a cross-sectional view of converting part of the AF material in the metal wiring layer into a void according to embodiments of the disclosure.

FIG. 8 depicts a cross-sectional view of a process to convert first AF material(s) 130 into void(s) 140 by evaporation. Here, UV light and/or heat may be applied to IC structure 100 from an external source to raise the temperature of first AF material 130 (FIG. 7) to its evaporation temperature. The material composition of first AF material 130 (e.g., carbon-based ERF materials) may be chosen for its ability to evaporate at temperatures that are too low to affect other portions of IC structure 100, including active materials in second region R2. At the evaporation temperature, evaporated portions of first AF material 130 may exit IC structure through opening(s) 150, thereby converting first AF material 130 into void(s) 140. Non-evaporated portions of first AF material 130 may remain within metal wiring layer(s) 102 as second AF material 144. In cases where polyimide material 116 includes a porous compound that is permeable to evaporated portions of first AF material 130, opening(s) 150 may be omitted, and void(s) 140 may form by passage of evaporated first AF material 130 through polyimide material 116.

Figure 9:
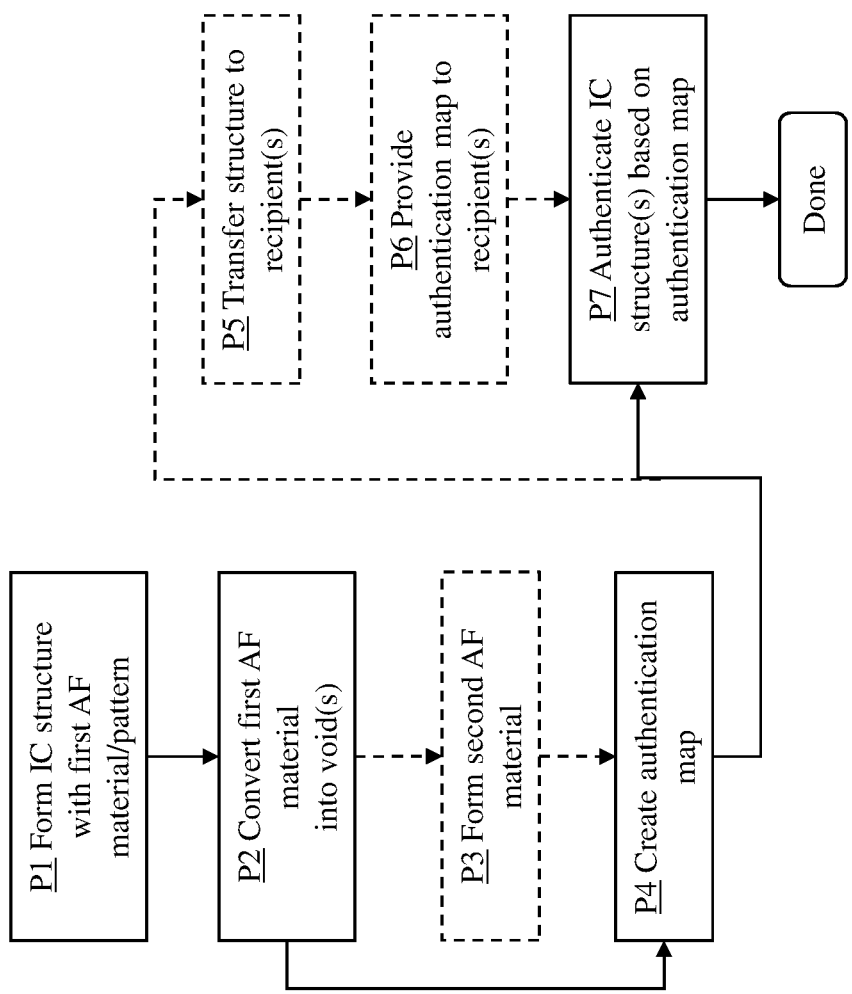
FIG. 9 depicts an illustrative flow diagram of methods for authenticating an IC structure according to embodiments of the disclosure.

FIG. 9 is an illustrative flow diagram depicting various processes for implementing methods according to the disclosure. It is understood that the various processes discussed herein may be implemented in a different order, with additional steps, and/or by omitting one or more steps in alternative configurations. Methods of the disclosure are operable to form various structures in first region R1 of IC structure 100, and such structures may be processed (e.g., converted into voids) for authentication with the aid of an authentication map or similar solution for verifying the location of voids in a structure.

Referring to FIGS. 2 and 9, methods according to the disclosure may include process P1 forming one or more regions of first AF material 130 in IC structure 100, e.g., in polyimide material 116 (or, alternatively, in metal wiring layer(s) 102 (e.g., as shown in FIGS. 7, 8). First AF material 130 formed in process P1 may be located in electrically inactive portions of IC structure 100, i.e., first region R1 that is physically and electrically separated from LI conductor(s) 118 or other active elements within second region R2. In some implementations, multiple regions of first AF material 130 may be formed in a pattern 132, such that the arrangement of first AF material(s) 130 is visually recognizable (e.g., a set of icons including shapes, letters, etc.). At the conclusion of process P1, first AF material 130 may be optically indistinct from the material in which it is formed (e.g., polyimide material 116, ILD layer(s) 112, and/or other insulative structures, as a result of being formed of a substantially translucent material such as an oxide, a carbon-based ERF material, and/or any material having a refractive index similar to dielectric materials.

Referring to FIGS. 4 and 9, methods of the disclosure may include process P2 of converting first AF material 130 (FIGS. 1, 2) into void(s) 140 within IC structure 100. The converting in process P2 may include, e.g., heating IC structure 100 to a temperature sufficient for evaporation of organic-based ERF materials (e.g., at least approximately three-hundred ° C.) via an external UV heat source, and/or other types of thermal sources. First AF material(s) 130 located within metal wiring layer(s) 102 may evaporate through pores in polyimide material 116, or through opening(s) 150 (FIGS. 7, 8) where applicable. In further implementations, the converting in process P2 may include etching of first AF material 130 to form void(s) 140 without etching or otherwise removing other material positioned adjacent to, or beneath, first AF material 130. Void(s) 140 produced from removing first AF material 130 may be optically distinct from polyimide material 116, ILD layer(s) 112 or other adjacent materials, e.g., by being formed of gas and thus having a different refractive index. Void(s) 140 are optically detectable via microscopy in other processes described herein.

Referring to FIGS. 6 and 9, methods according to the disclosure optionally may include an additional process P3 of forming second AF material 144 within void(s) 140. The forming of second AF material 144 may include a second deposition of carbon-based ERF material, oxide material, etc., in selected portions of void(s) 140 without forming second AF material 144 in other locations. In some implementations, process P3 may be integrated into process P2, e.g., by converting only some portions of first AF material 130 (FIGS. 1, 2) into void(s) 140, while remaining portions of the material become second AF material 144. At the conclusion of process P2, or P3, pattern 142 may be formed within IC structure 100, in which pattern 142 includes void(s) 140 or a combination of void(s) 140 and second AF material 144. Pattern 142, in addition, may be physically and electrically isolated from electrically active components within second region R2 of IC structure 100 (e.g., LI conductor(s) 118) and thus may have no operational effect on IC structure 100.

Methods according to the disclosure may include process P4 of creating an authentication map of IC structure 100. The authentication map created in process P4 may include a visual depiction, set of coordinates, and/or other guide for indicating the location of void(s) 140 in IC structure 100. The location of void(s) 140 in the authentication map may include pattern 142. In some cases, the authentication map may include pattern 142 with both void(s) 140 and second AF material 144, and may additionally or alternatively include pattern 142 without any second AF material 144. In further implementations, process P4 may include creating multiple authentication maps, each of which may correspond to different states of IC structure 100 such as pattern 142 with second AF material 144 included, pattern 142 only with void(s) 140, etc. The authentication map created in process P4 may take the form of computer program code stored on a non-transitory storage medium, and thus may be transmitted to other parties via the internet or other solutions for transmission of data from one entity to another.

Methods of the disclosure may be particularly effective for detecting whether intermediate recipients of IC structure 100 in a supply chain have tampered with IC structure 100. Such tampering may raise IC structure 100 to a temperature at which first AF material 130 (FIGS. 1, 2) or second AF material 144 evaporates, and/or other types of processing that may inadvertently remove portions of first AF material 130 or second AF material 144. Such processing may increase the number of void(s) 140 and/or alter pattern 142, and thus cause IC structure 100 to be different from its authentication map. Process P5 according to the disclosure may include transferring IC structure 100 to one or more recipients, e.g., an intended user of the product. The transferring of IC structure 100 may be direct from the manufacturer to a customer, and/or may be through one or more intermediate recipients such as intermediate manufacturers, transporters, etc., in a supply chain for the product. Process P6, which may occur before, during, or after process P5, may include providing the authentication map(s) to one or more recipients of IC structure 100. Providing the authentication map may include, e.g., electronically transferring the authentication map as data from one entity (e.g., the manufacturer of IC structure 100) to another (e.g., the eventual customer). In some cases, e.g., where the customer already has IC structure 100 and/or its authentication map(s), processes P5, P6 may be omitted.

Process P7 in methods according to the disclosure may include authenticating IC structure 100 based on the authentication map(s) created in process P4. The authenticating process P7 may include optically inspecting IC structure 100 via a microscope and/or other imaging tools. In an example, process P7 may include optically inspecting IC structure 100, and authenticating IC structure 100 by checking to see whether the location of void(s) 140 and/or shape of pattern 142 therein matches the authentication map in process P4. In a further example, the recipient of IC structure 100 may authenticate IC structure 100 by heating it to an evaporation temperature as discussed herein, and thereafter comparing the location of void(s) 140 and/or pattern 142 in IC structure 100 with the authentication map. In cases where the location of void(s) 140 and/or pattern 142 match the authentication map, IC structure 100 is deemed to be authentic. In cases where the location of void(s) 140 and/or pattern 142 do not match the authentication map, IC structure 100 is deemed to be inauthentic (e.g., manufactured by another entity, tampered with, and/or otherwise in non-compliance with its original specification). In either case, the method may conclude ("Done"), and the recipient may use IC structure 100 or notify the manufacturer where applicable.

Embodiments of the disclosure provide several technical and commercial advantages, some of which are discussed herein as examples. As is evident from the discussion herein, embodiments of the disclosure allow IC structure 100 to be manufactured with built-in authentication features, thereby allowing IC structure 100 to be optically authenticated without specialized equipment (e.g., imaging tools other than microscopes). Embodiments of the disclosure also ensure that the authentication features (e.g., void(s) 140 and/or pattern 142)) or portions thereof are not detectable until a predetermined event occurs, e.g., raising the temperature of IC structure 100 for evaporation of targeted materials, etching of oxide(s) via a mask, etc. By using AF materials that are optically indistinct from adjacent materials (e.g., polyimide materials, dielectric layers, etc.), it may be impossible or impracticable for third parties other than the recipient to detect the AF materials. It may also be difficult or impossible for third parties to modify and/or tamper with IC structure 100 without inadvertently converting AF materials therein (e.g., first AF material 130 (FIGS. 1, 2) into void(s) 140.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The structure and method as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a polyimide layer over a plurality of metal wiring layers, the polyimide layer including a first region having at least one electrically active element, and a second region horizontally distal to the at least one electrically active element; and
   a void within the second region of the polyimide layer, wherein a location of the void within the polyimide layer defines an authentication pattern for the IC structure, and the location of the void is optically detectable from outside the IC structure to provide authentication of the IC structure.

2. The IC structure of claim 1, wherein the void overlies a metal wire within one of the plurality of metal wiring layers.

3. The IC structure of claim 1, further comprising an authentication film (AF) material within the second region of the polyimide layer, wherein the authentication pattern for the IC structure further includes a location of the AF material.

4. The IC structure of claim 3, wherein the AF material includes a carbon-based energy removal film (ERF).

5. The IC structure of claim 3, wherein the AF material is non-uniformly distributed within the void.

6. An integrated circuit (IC) structure, comprising:
   a polyimide layer;
   a metal wiring layer beneath the polyimide layer, the metal wiring layer including a first region having at least one electrically active element, and a second region horizontally distal to the at least one electrically active element; and
   a void within the second region of the metal wiring layer, wherein a location of the void within the metal wiring layer defines an authentication pattern for the IC structure, and the location of the void is optically detectable from outside the IC structure to provide authentication of the IC structure.

7. The IC structure of claim 6, further comprising an authentication film (AF) material within the second region of the metal wiring layer, wherein the authentication pattern for the IC structure further includes a location of the AF material.

8. The IC structure of claim 7, wherein the AF material includes a carbon-based energy removal film (ERF).

9. The IC structure of claim 7, wherein the AF material is non-uniformly distributed within the void.

10. The IC structure of claim 7, further comprising at least one opening through the polyimide layer to the metal wiring layer, the at least one opening being sized for evaporation of the AF material.

11. A method to authenticate the IC structure of claim 6, the method comprising:
    forming a first authentication film (AF) material within the second region of the of the metal wiring layer;
    converting the first AF material into the void within the second region of the metal wiring layer; and
    creating an authentication map of the IC structure, the authentication map including the location of the void within the metal wiring layer for authentication of the IC structure.

12. A method to authenticate the IC structure of claim 1, the method comprising:
    forming a first authentication film (AF) material within the second region of the polyimide layer;
    converting the first AF material into the void within the second region of the polyimide layer; and
    creating an authentication map of the IC structure, the authentication map including the location of the void within the second region for authentication of the IC structure.

13. The method of claim 12, wherein a composition of the first AF material is different from an adjacent material within the IC structure.

14. The method of claim 12, wherein the first AF material is formed within a portion of the plurality of metal wiring layers, wherein the portion of the plurality of wiring layers includes at least one opening through the polyimide layer sized for evaporation of the first AF material.

15. The method of claim 12, wherein converting the first AF material into the void includes evaporating the first AF material.

16. The method of claim 12, further comprising forming a second AF material within the IC structure, wherein at least a portion of the void does not include the second AF material, and the authentication map further includes a location of the second AF material in the IC structure.

17. The method of claim 16, wherein forming the second AF material includes non-uniformly distributing the second AF material within the void.

18. The method of claim 12, further comprising providing the authentication map to a recipient of the IC structure.

* * * * *